United States Patent
Halliyal et al.

(10) Patent No.: US 6,645,882 B1
(45) Date of Patent: Nov. 11, 2003

(54) PREPARATION OF COMPOSITE HIGH-K/ STANDARD-K DIELECTRICS FOR SEMICONDUCTOR DEVICES

(75) Inventors: Arvind Halliyal, Cupertino, CA (US);
Joong S. Jeon, Cupertino, CA (US);
Minh Van Ngo, Fremont, CA (US);
Robert B. Ogle, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 9 days.

(21) Appl. No.: 10/051,790

(22) Filed: Jan. 17, 2002

(51) Int. Cl.$^7$ ............................... H01L 21/469
(52) U.S. Cl. ..................... 438/785; 438/791
(58) Field of Search .................. 438/197, 200, 438/240, 261, 287, 585, 591, 761, 785, 791

(56) References Cited

U.S. PATENT DOCUMENTS

| | | | |
|---|---|---|---|
| 5,015,502 A | 5/1991 | Strangman et al. | 427/248.1 |
| 5,120,672 A | 6/1992 | Mitchell et al. | 437/43 |
| 5,648,113 A | 7/1997 | Barbee et al. | 427/8 |
| 5,654,035 A | 8/1997 | Ljungberg et al. | 427/255.3 |
| 5,907,766 A * | 5/1999 | Swanson et al. | 438/72 |
| 6,008,091 A | 12/1999 | Gregor et al. | 438/261 |
| 6,037,003 A | 3/2000 | Gordon et al. | 427/255.34 |
| 6,171,900 B1 | 1/2001 | Sun | 438/240 |
| 6,278,166 B1 | 8/2001 | Ogle, Jr. | 257/411 |
| 6,319,730 B1 | 11/2001 | Ramdani et al. | 438/3 |
| 6,406,960 B1 | 6/2002 | Hopper et al. | 438/261 |
| 6,407,435 B1 * | 6/2002 | Ma et al. | 257/411 |
| 6,420,279 B1 | 7/2002 | Ono et al. | 438/785 |
| 6,451,641 B1 * | 9/2002 | Halliyal et al. | 438/200 |
| 6,451,647 B1 * | 9/2002 | Yang et al. | 438/240 |
| 6,573,197 B2 * | 6/2003 | Callegari et al. | 438/791 |
| 2002/0106536 A1 | 8/2002 | Lee et al. | 428/702 |
| 2002/0115252 A1 | 8/2002 | Haukka et al. | 438/240 |
| 2002/0142624 A1 | 10/2002 | Levy et al. | 438/786 |

OTHER PUBLICATIONS

Kukli et al.; "Tailoring the Dielectric Properties of Hfo$_2$— Ta$_2$O$_5$ Nanolaminates"; Appl. Phys. Lett., vol. 68 No. 26, Jun. 24, 1996.

Zhang et al.; "High Permittivity Thin Film Nanolaminates"; Journal of Applied Physics; vol. 87, No. 4, Feb. 15, 2000.

* cited by examiner

Primary Examiner—Hoai Ho
Assistant Examiner—David Vu
(74) Attorney, Agent, or Firm—Renner, Otto, Boisselle & Sklar, LLP

(57) ABSTRACT

A semiconductor device and a method of fabricating the semiconductor device having a composite dielectric layer including steps of providing a semiconductor substrate; depositing on the semiconductor substrate alternating sub-layers of a first dielectric material and a second dielectric material to form a layered dielectric structure having at least two sub-layers of at least one of the first dielectric material and the second dielectric material, in which one of the first dielectric material and the second dielectric material is a high-K dielectric material and an other of the first dielectric material and the second dielectric material is a standard-K dielectric material comprising aluminum oxide; and annealing the layered dielectric structure at an elevated temperature to form a composite dielectric layer.

20 Claims, 4 Drawing Sheets

PREPARATION OF COMPOSITE HIGH-K/ STANDARD-K DIELECTRICS FOR SEMICONDUCTOR DEVICES

FIELD OF THE INVENTION

The invention relates generally to the fabrication of semiconductor devices and, more particularly, to the fabrication of high-K dielectric layers in semiconductor devices.

BACKGROUND OF THE INVENTION

Fabrication of semiconductor devices, such as a metal-oxide-semiconductor (MOS) integrated circuit, involves numerous processing steps. In a semiconductor device, a gate dielectric, typically formed from silicon dioxide ("oxide"), is formed on a semiconductor substrate which is doped with either n-type or p-type impurities. For each MOS field effect transistor (MOSFET) being formed, a gate conductor is formed over the gate dielectric, and dopant impurities are introduced into the substrate to form a source and drain. A pervasive trend in modern integrated circuit manufacture is to produce transistors having feature sizes as small as possible. Many present processes employ features, such as gate conductors and interconnects, which have less than 0.18 μm critical dimension. As feature sizes continue to decrease, the size of the resulting transistor as well as the interconnect between transistors also decreases. Fabrication of smaller transistors allows more transistors to be placed on a single die, thereby allowing relatively large circuit systems to be incorporated on a single, relatively small die area.

As MOSFET feature sizes decrease, gate oxide thickness decreases as well. This decrease in gate oxide thickness is driven in part by the demands of overall device scaling. As gate conductor widths decrease, for example, other device dimensions must also decrease in order to maintain proper device operation. Early MOSFET scaling techniques involved decreasing all dimensions and voltages by a constant scaling factor, to maintain constant electric fields in the device as the feature size decreased. This approach has given way to more flexible scaling guidelines which account for operating characteristics of short-channel devices. For example, a maximum value of MOSFET subthreshold current can be maintained while feature sizes shrink, by decreasing any or all of several quantities, including gate oxide thickness, operating voltage, depletion width, and junction depth, by appropriate amounts.

As a result of the continuing decrease in feature size, gate oxide thickness has been reduced so much that oxides are approaching thicknesses below ten angstroms (Å). Unfortunately, thin oxide films may break down when subjected to an electric field, particularly for gate oxides less than 20 Å thick. It is probable that even for a relatively low gate voltage of 3V, electrons can pass through such a thin gate oxide by a quantum mechanical tunneling effect. In this manner, a tunneling current may undesirably form between the semiconductor substrate and the gate conductor, adversely affecting the operability of the device. It is postulated that some of these electrons may become entrapped within the gate oxide by, e.g., dangling bonds. As a result, a net negative charge density may form in the gate oxide. As the trapped charge accumulates with time, the threshold voltage VT may shift from its design specification. Breakdown of the gate oxide may also occur at even lower values of gate voltage, as a result of defects in the gate oxide. Such defects are unfortunately more pronounced in relatively thin gate oxides, since any given defect is more likely to have an adverse effect on the function of the gate oxide. For example, a thin gate oxide often contains pinholes and/or localized voids due to unevenness at which the oxide grows on a less than perfect silicon lattice. Such unevenness is tolerable at greater thicknesses, but is less so in very thin gate oxides.

A more promising approach to solve the problem of thin gate oxide is to increase the permittivity of the gate dielectric. Permittivity, $\in$, of a material reflects the ability of the material to be polarized by an electric field. The permittivity of a material is typically described as its permittivity normalized to the permittivity of a vacuum, $\in_0$. Hence, the relative permittivity, referred to as the dielectric constant, of a material is defined as:

$$K = \in / \in_0$$

While silicon dioxide (sometimes simply referred to as "oxide") has a dielectric constant of approximately 4, other dielectric materials have higher K values. Silicon nitride ("nitride"), for example, has a K of about 6 to 9 (depending on formation conditions). Much higher K values of, for example, 20 or more can be obtained with various transition metal oxides including hafnium oxide ($HfO_2$), zirconium oxide, ($ZrO_2$), barium strontium titanate ("BST"), lead zirconate titanate ("PZT"), and others described more fully below. Using a high-K dielectric material for a gate dielectric would allow a low electrical thickness gate oxide thickness to be achieved even with a physically thick dielectric layer. For example, a high-K gate dielectric with a K of 40 and a thickness of 100 angstroms is substantially electrically equivalent to a silicon dioxide gate dielectric (K about 4) having a thickness of about 10 angstroms. The electrically equivalent thickness of high-K materials may be referred to in terms of the equivalent oxide thickness. Thus, the high-K gate dielectric having a K of 40 and a given physical thickness has an equivalent oxide thickness which is approximately 1/10 the given physical thickness. For even higher-K dielectric materials, even thicker gate dielectric layers can be formed while maintaining equivalent oxide thickness values lower than are possible with very thin oxide layers. In this way, the reliability problems associated with very thin dielectric layers may be avoided while transistor performance is increased.

One problem which has been reported relating to integration of high-K dielectric materials is oxidation of silicon by certain high-K dielectric materials when the high-K dielectric material is formed directly on a silicon substrate. Since oxidation results in formation of what may be referred to as a "standard-K" dielectric material, i.e., silicon dioxide, some of the benefit of the high-K dielectric material is considered to be lost. In addition, reactions considered adverse between the high-K dielectric material and silicon, silicon dioxide or other standard-K dielectric materials may also occur.

Thus, a method of forming a relatively high-K dielectric material which either overcomes or takes advantage of such reactions, or both, and which provides the electrical advantages of a higher K dielectric material, is needed.

SUMMARY OF THE INVENTION

The present invention relates to a method of fabricating a semiconductor device having a composite dielectric layer, including the steps of providing a semiconductor substrate; depositing on the semiconductor substrate alternating sub-layers of a first dielectric material and a second dielectric material to form a layered dielectric structure having at least two sub-layers of at least one of the first dielectric material and the second dielectric material, wherein one of the first dielectric material and the second dielectric material is a high-K dielectric material and an other of the first dielectric material and the second dielectric material is a standard-K dielectric material comprising aluminum oxide; and annealing the layered dielectric structure at an elevated temperature to form a composite dielectric layer.

The present invention further relates to a semiconductor device having a composite dielectric layer, including a semiconductor substrate; alternating sub-layers of a first dielectric material and a second dielectric material on the semiconductor substrate, the sub-layers forming a layered dielectric structure having at least two sub-layers of at least one of the first dielectric material and the second dielectric material, wherein one of the first dielectric material and the second dielectric material is a high-K dielectric material and an other of the first dielectric material and the second dielectric material is a standard-K dielectric material comprising aluminum oxide; and the composite dielectric layer includes a reaction product of the high-K dielectric material and the standard-K dielectric material.

Thus, the present invention provides a solution to the problem of forming a high-K dielectric material which both overcomes and takes advantage of previously disfavored reactions between dielectric materials, to form a composite dielectric layer which includes a reaction product of the high-K dielectric material and the standard-K dielectric material, which is obtained by annealing a layered dielectric structure at an elevated temperature.

DETAILED DESCRIPTION

Figure 1:
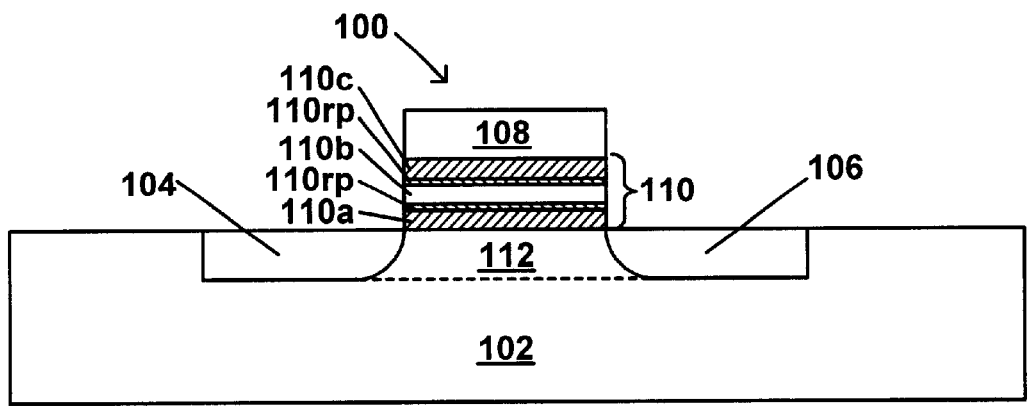
FIG. 1 is a schematic cross-sectional view of a field effect transistor including an embodiment of a composite dielectric layer in accordance with the present invention.

As used herein, the term "standard-K dielectric" refers to a dielectric material having a K up to about 10. Such standard-K dielectric materials include, for example, silicon dioxide, which has a K of about 4, silicon oxynitride, which has a K of about 4–8 depending on the relative content of oxygen and nitrogen, and silicon nitride, which has a K of about 6–9, and aluminum oxide, which has a K of about 10.

As used herein, the term "mid-K dielectric material" refers to a dielectric material having a K in the range from greater than 10 to about 20. Such mid-K dielectric materials include, for example, composite materials such as hafnium silicate, which has a K of about 14, and hafnium silicon oxynitride, which has a K of about 16, depending on the relative content of oxygen and nitrogen, and hafnium silicon nitride, which has a K of about 18.

As used herein, the term "high-K dielectric" refers to a dielectric material having a K of about 20 or more. Such high-K dielectric materials include, for example, $HfO_2$, $ZrO_2$, $Ta_2O_5$ and others, some of which are identified more fully below. In general, the term "high-K dielectric material" encompasses binary, ternary and higher oxides and any ferroelectric material having a K of about 20 or more.

Approximate K-values or, in some cases, a range of K-values, are shown below in Table 1 for several exemplary dielectric materials. It is understood that the present invention is not limited to the specific dielectric materials disclosed herein, but may include any appropriate standard-K and high-K dielectric materials which are known and are compatible with the remaining elements of the semiconductor device with which the dielectric materials are to be used.

TABLE 1

| Dielectric Material | Approximate Dielectric Constant (K.) (Relative Permittivity) |
| --- | --- |
| silicon dioxide | 4 |
| silicon nitride | 6–9 |
| silicon oxynitride | 4–8 |
| aluminum oxide | 10 |
| zirconium silicate | 12 |
| hafnium silicate | 15 |
| lanthanum oxide, $La_2O_3$ | 20–30 |
| hafnium oxide, $HfO_2$ | 40 |
| zirconium oxide, $ZrO_2$ | 25 |
| cerium oxide, $CeO_2$ | 26 |
| bismuth silicon oxide, $Bi_4Si_2O_{12}$ | 35–75 |
| titanium dioxide, $TiO_2$ | 30 |
| tantalum oxide, $Ta_2O_5$ | 26 |
| tungsten oxide, $WO_3$ | 42 |
| yttrium oxide, $Y_2O_3$ | 20 |
| $LaAlO_3$ | 25 |
| BST ($Ba_{1-x}Sr_xTiO_3$) | ~20—~200 |
| $PbTiO_3$ | ~20—~200 |
| $BaTiO_3$ | ~20—~200 |
| $SiTiO_3$ | ~20—~200 |
| $PbZrO_3$ | ~20—~200 |
| PST ($PbSc_xTa_{1-x}O_3$) | ~200—3000 |
| PZN ($PbZn_xNb_{1-x}O_3$) | ~200—5000 |
| PZT ($PbZr_xTi_{1-x}O_3$) | ~100—1000 |
| PMN ($PbMg_xNb_{1-x}O_3$) | ~200—5000 |

It is noted that the K-values, or relative permittivity, for both standard-K and high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula $Ta_2O_5$. As used herein, the term "tantalum oxide" may include variants of stoichiometric $Ta_2O_5$, which may be referred to as $Ta_xO_y$, in which either of x or y vary by a small amount. For example, in one embodiment, x may vary from about 1.5 to 2.5, and y may vary from about 4.5 to about 5.5. In another embodiment, x may vary from about 1.75 to 2.25, and y may vary from about 4 to about 6. Such variations from the exact stoichiometric formula fall within the definition of tantalum oxide. Similar variations from exact stoichiometry are included when the chemical formula for a compound is used. For example, again using tantalum oxide as an example, when the formula $Ta_2O_5$ is used, $Ta_xO_y$, as defined above, is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Here and in all numerical values in the specification and claims, the limits of the ranges and ratios may be combined.

As used herein, the term "anneal" or "annealing" refers to a step or process in which a material is exposed to an elevated temperature for a time. The annealing may be a discrete step of annealing, such as a RTA, or it may be part of another step, such as a CVD, which is carried out at an elevated temperature. In either case, annealing includes exposure to an elevated temperature, and may include appropriate additional conditions, such as a selected atmosphere and pressure, for a selected period of time.

Semiconductor Devices

The present invention is described hereinbelow in terms of a common semiconductor device, specifically, a metal oxide semiconductor field effect transistor (MOSFET) formed on a silicon substrate. An embodiment of the present invention in a MOSFET is shown in FIG. 1. The present invention is not limited to this illustrative embodiment, however, and may be applied to any semiconductor device in which a dielectric layer is needed, for example, as a gate dielectric in a FET, as a gate dielectric in a floating gate EEPROM flash memory device, in a SONOS-type flash memory device, such as the Mirror-Bit™ SONOS-type flash memory device available from Advanced Micro Devices, Sunnyvale, Calif. Thus, it is to be understood that the present invention is not limited to the specific illustrative embodiments described below.

The present invention relates to a semiconductor device and to a method for fabricating the semiconductor device, in which the semiconductor device includes a composite dielectric layer formed from a plurality of alternating sub-layers of a high-K dielectric material and a standard-K dielectric material in a layered dielectric structure. In one embodiment, the standard-K dielectric material is aluminum oxide, $Al_2O_3$. In one embodiment, the standard-K dielectric material comprises aluminum oxide and a silicon-containing standard-K dielectric material. The layered dielectric structure is subsequently annealed, as a result of which a composite dielectric layer is formed. In one embodiment, the composite dielectric layer comprises a reaction product which is a metal aluminate, in which the metal comprises at least one high-K derived metal. In one embodiment, the composite dielectric layer comprises a reaction product which is a mixed metal aluminate/silicate, in which the metal comprises at least one high-K derived metal.

Figure 4:
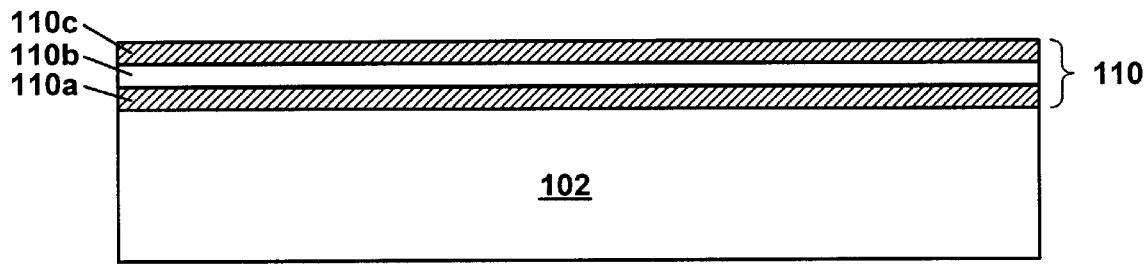
FIG. 4 is a schematic cross-sectional view of a semiconductor substrate with first, second and third sub-layers applied thereto in accordance with the present invention.
Figure 5:
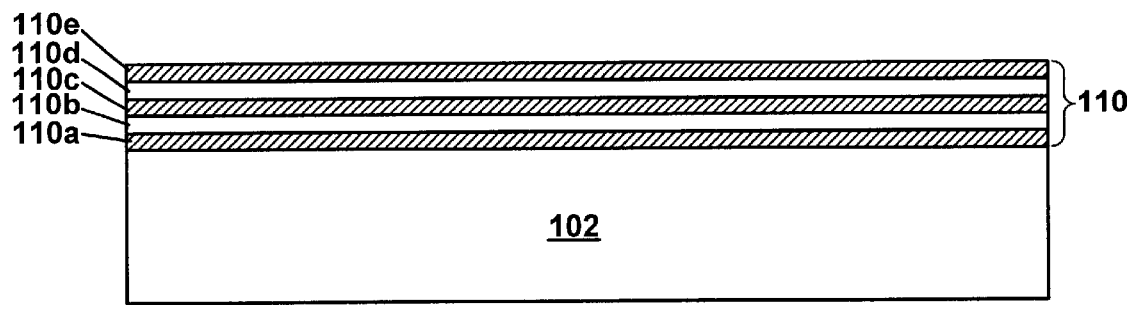
FIG. 5 is a schematic cross-sectional view of a semiconductor substrate with first through fifth sub-layers applied thereto in accordance with the present invention.
Figure 6:
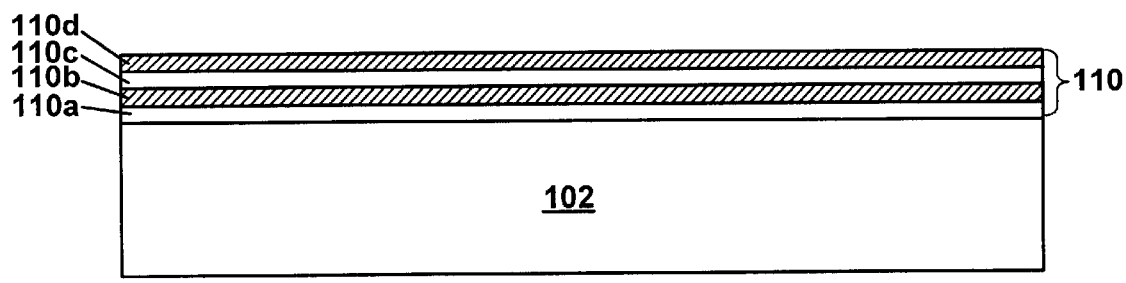
FIG. 6 is a schematic cross-sectional view of a semiconductor substrate with first through fourth sub-layers applied thereto in accordance with the present invention.

Thus, in a first embodiment, the present invention relates to a semiconductor device having a composite dielectric layer. The semiconductor device includes a semiconductor substrate and at least one composite dielectric layer including and/or formed from alternating sub-layers of a first dielectric material and a second dielectric material on the semiconductor substrate. Together, prior to annealing, the alternating sub-layers form a layered dielectric structure having at least two sub-layers of at least one of the first dielectric material and the second dielectric material. One of the first dielectric material and the second dielectric material is a high-K dielectric material. The other of the first and second dielectric materials is a standard-K dielectric material. In one embodiment, the standard-K dielectric material comprises aluminum oxide. Examples of embodiments prior to annealing are shown in FIGS. 4–6.

The composite dielectric layer formed by annealing at a high temperature the layered dielectric structure includes a reaction product of the high-K dielectric material and the standard-K dielectric material. The reaction product is formed during the annealing of the alternating sub-layers of the first and second dielectric materials, at a high temperature. At the annealing temperature, the alternating sub-layers of dielectric materials combine or react with each other, at least at the interfaces of the alternating sub-layers, to form the composite dielectric layer which includes a reaction product of the dielectric materials of the respective sub-layers. The reaction product and/or the composite dielectric layer as a whole may have a K-value intermediate the K-values of the high-K dielectric material and standard-K dielectric material from which the reaction product was formed. Thus, the reaction product may be referred to as a mid-K dielectric material, as defined above. Examples of the composite dielectric layer of the present invention are shown in FIG. 1 and FIGS. 7–9.

In one embodiment, the annealing at a high temperature may be any type of annealing or thermal treatment such as a post deposition annealing, RTA, or thermal heating applied by or during a subsequent deposition step. In such an embodiment, the annealing at a high temperature need not immediately follow the preceding steps of the method of the present invention, and other production steps may intervene between these steps, within the scope of the invention. In another embodiment, the step of annealing at a high temperature follows substantially immediately the preceding steps of the method, not including any routine handling and preparatory steps which may be needed. In one embodiment, the step of annealing at a high temperature takes place in the same apparatus in which the sub-layers are deposited.

In one embodiment, the semiconductor substrate is a bulk silicon substrate. In one embodiment, the semiconductor substrate is a silicon-on-insulator semiconductor substrate. In another embodiment, the semiconductor substrate is a p-doped or an n-doped silicon substrate. Suitable semiconductor substrates include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention is not limited to any particular type of semiconductor substrate.

FIG. 1 is a schematic cross-sectional view of a MOSFET 100. The MOSFET 100 includes, for example, a p-doped silicon substrate 102, an n-doped source region 104, an n-doped drain region 106, a gate 108, a gate composite dielectric layer 110, and a channel region 112.

Not shown in FIG. 1 are additional parts of a working semiconductor device, such as electrical conductors, protective coatings and other parts of the structure which would be included in a complete, working semiconductor device. These additional parts are not necessary to the present invention, and for simplicity and brevity are neither shown nor described, but could be easily added as will be understood by those of skill in the art.

The gate composite dielectric layer 110 illustrated in FIG. 1 has a structure including five sub-layers, and is a composite dielectric layer. The gate composite dielectric layer 110 illustrated in FIG. 1 has two sub-layers 110a and 110c of a first dielectric material and one sub-layer 110b of a second dielectric material, and two sub-layers 110rp of a reaction product resulting from the reaction or combination of the dielectric materials of the sub-layer 110a with one side of the sub-layer 110b and the other side of the sub-layer 110b with the sub-layer 110c.

The layered dielectric structure 110 of FIG. 1 comprises three alternating sub-layers 110a–110c, each sub-layer separated from the next by a reaction product sub-layer 110rp. The layered dielectric structure 110 could comprise any number of additinal alternating sub-layers 110a–110ω, where ω represents a letter corresponding to the number of sub-layers, from 3 to about 10, with each pair of sub-layers separated by a reaction product sub-layer 110rp, following the annealing step. In one embodiment, the layered dielectric structure includes four alternating sub-layers ((ω=4), in another, five alternating sub-layers ((ω=5), and in another six alternating sub-layers ((ω=6), and in yet another, seven alternating sub-layers ((ω=7). Higher numbers of alternating sub-layers may be present, but from 3 to about 7 alternating sub-layers ((ω=3–7) are considered most useful at present. In each case, each of the sub-layers of dielectric materials, following the annealing step, are separated by a reaction product sub-layer 110rp. As described more fully below, the relative thickness of these sub-layers may be selected and controlled as desired.

In one embodiment, the alternating sub-layers are completely combined or reacted together to form a substantially uniform composite dielectric layer. The substantially uniform composite dielectric layer, in one embodiment, comprises substantially only the reaction product of the high-K and standard-K dielectric material. Thus in one embodiment, the present invention provides a semiconductor device having a composite dielectric layer, including a semiconductor substrate; a composite gate dielectric layer on the semiconductor substrate, the composite gate dielectric layer comprising a reaction product of a first dielectric material and a second dielectric material, in which one of the first dielectric material and the second dielectric material is a high-K dielectric material and an other of the first dielectric material and the second dielectric material is a standard-K dielectric material comprising aluminum oxide; and the reaction product comprises a metal aluminate, in which the metal is a high-K derived metal.

The layered dielectric structure 110 shown in FIG. 4 includes two similar sub-layers 110a and 110c, and a dissimilar third sub-layer, 110b. In one embodiment, the two similar sub-layers 110a and 110c each comprise a high-K dielectric material, and the dissimilar third sub-layer 110b comprises a standard-K dielectric material. In another embodiment, the opposite arrangement is used, i.e., the two similar sub-layers 110a and 110c each comprise a standard-K dielectric material, and the dissimilar third sub-layer 110b comprises a high-K dielectric material. In the embodiment shown in FIG. 5, the layered dielectric structure 110 comprises five sub-layers, 110a–110e, alternating in a pattern which continues that described above for three sub-layers 110a–110c. In the embodiment shown in FIG. 6, the layered dielectric structure 110 comprises four sub-layers, 110a–110d, alternating in a pattern which is similar to that described above for three sub-layers 110a–110c, except that the lowermost and uppermost sub-layers, 110a and 110d, are different in this embodiment. In other embodiments, the number of sub-layers may vary as described above, but the sub-layers alternate in each such embodiment. Docket No. G0533 As noted above with respect to FIG. 6, in an embodiment in which there is an even number of sub-layers in the layered dielectric structure 110, the lowermost sub-layer may be a high-K dielectric material and the uppermost sub-layer may be a standard-K dielectric material. In another embodiment having an even number of sub-layers in the layered dielectric structure 110, the lowermost sub-layer may be a standard-K dielectric material and the uppermost sub-layer may be a high-K dielectric material. FIG. 6 is applicable to either even number sub-layer case. In one embodiment, the lowermost sub-layer is silicon dioxide, formed by oxidation of the silicon surface of the semiconductor substrate as a result of deposition of a high-K layer directly on the semiconductor substrate.

In summary, the number of sub-layers 110a–110ω of the layered dielectric structure 110 may be odd or even, and the uppermost and lowermost sub-layers may be either the high-K dielectric material or the standard-K dielectric material, and the number of sub-layers of each type may be equal or unequal. The first dielectric material may be the high-K dielectric material or the standard-K dielectric material, and conversely, the second dielectric material may be the high-K dielectric material or the standard-K dielectric material.

Although not described in detail for the sake of brevity, in an embodiment in which there is a plurality of dielectric material sub-layers of either or both types, the plurality of high-K dielectric material sub-layers and standard-K dielectric material sub-layers may comprise more than one dielectric material. Thus, within the scope of the invention is an embodiment comprising two or more sub-layers of high-K dielectric material in which the sub-layers each contain a different dielectric material. Similarly, within the scope of the invention is an embodiment comprising two or more sub-layers of standard-K dielectric material in which the sub-layers each contain a different dielectric material, and an embodiment in which both types of dielectric materials differ. As a specific example, is a five sub-layer embodiment comprising a silicon dioxide sub-layer, over which is deposited a sub-layer of hafnium oxide, over which is deposited a sub-layer of aluminum oxide, over which is deposited a sub-layer of zirconium oxide, over which is deposited a sub-layer of aluminum oxide. Thus, such mixed dielectric material embodiments are within the scope of the invention and claims.

In one embodiment, the standard-K dielectric material includes aluminum oxide. In one embodiment, the standard-K dielectric material includes aluminum oxide and at least one of silicon dioxide, silicon oxynitride, silicon nitride and silicon-rich silicon nitride. Thus, in one embodiment of the present invention, the standard-K dielectric material comprises aluminum, and in another embodiment, the standard-K dielectric material comprises aluminum and silicon. In one embodiment, the standard-K dielectric material is aluminum oxide. In one embodiment, the standard-K dielectric material comprises both aluminum oxide and silicon dioxide. In one embodiment, the standard-K dielectric material comprises both aluminum oxide and silicon nitride. In one embodiment, the standard-K dielectric material comprises both aluminum oxide and silicon oxynitride. In one embodiment, the standard-K dielectric material comprises both aluminum oxide and two or all three of silicon dioxide, silicon nitride and silicon oxynitride.

In one embodiment, the high-K dielectric material includes at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$). In addition to the foregoing high-K dielectrics, other high-K dielectric materials, for example, ferroelectric high-K dielectric materials such as lead lanthanum titanate, strontium bismuth tantalate, bismuth titanate and barium zirconium titanate may be suitably used in the present invention. Other high-K dielectric materials known in the art, including, for example binary and ternary oxides having K values of about 20 or higher, also may be used in the present invention.

The composite dielectric layer, comprising the reaction product of the high-K dielectric material and the standard-K dielectric material, is formed by annealing the layered dielectric structure at an elevated temperature. The reaction product includes the elements of both the high-K dielectric material and the standard-K dielectric material.

As used herein, the term "high-K derived metal" refers to a metal which is or was originally part of the high-K dielectric material. In the herein-described metal aluminates, the metal is a high-K derived metal and aluminum is not considered to be among the group of high-K derived metals. Similarly, in the herein-described mixed metal aluminate/silicate dielectric materials, the metal is derived from the high-K dielectric material, and the aluminum is not one of the high-K derived metals. Thus, for the purposes of the present invention, aluminum is not considered to be among the "high-K derived metals" obtained from the high-K dielectric material.

For example, in an embodiment in which the high-K dielectric material is hafnium oxide and the standard-K dielectric material is aluminum oxide, the reaction product is an aluminate compound containing hafnium, aluminum and oxygen, Hf/Al/O. In one embodiment, the reaction product is hafnium aluminate, $HfAl_2O_5$. Thus, in an embodiment in which the high-K dielectric material contains a metal atom, e.g., in the form of a metal oxide, and the standard-K dielectric material is an aluminum oxide, the reaction product is a metal-containing aluminate, where the metal is a high -K derived metal, as defined above. In an embodiment in which the high-K dielectric material is hafnium and the standard-K dielectric material contains both aluminum oxide and one or more of silicon dioxide, silicon oxynitride, or silicon nitride, the reaction product in the composite dielectric layer includes hafnium, aluminum, silicon, and either or both oxygen and/or nitrogen.

In another embodiment, the high-K dielectric material is zirconium oxide and the standard-K dielectric material is aluminum oxide, and the composite dielectric layer includes zirconium, aluminum and oxygen. In one such embodiment, the reaction product is zirconium aluminate, $ZrAl_2O_5$. In yet another embodiment, the high-K dielectric material is cerium oxide and the standard-K dielectric material is aluminum oxide, and the composite dielectric layer includes cerium, aluminum and oxygen. In still another embodiment, the high-K dielectric material is tantalum oxide and the standard-K dielectric material comprises both aluminum oxide and silicon nitride, and the composite dielectric layer includes tantalum, aluminum, silicon, oxygen and nitrogen. As demonstrated by the foregoing embodiments, the reaction product generally is a composite of the high-K dielectric material and the standard-K dielectric material. As in the above examples with hafnium, when one of the compounds of silicon, oxygen and nitrogen is included as a standard-K dielectric material with the aluminum oxide, the composite dielectric layer may also include silicon and nitrogen, in addition to the high-K derived metal, aluminum and oxygen.

The reaction product, which is a dielectric material comprising a composite of a high-K dielectric material and a standard-K dielectric material, in one embodiment has a K in the range from greater than 10 to about 20. In another embodiment, the reaction product has a K which is intermediate the K of the high-K dielectric material and the K of the standard-K dielectric material. Thus, the reaction product, or composite dielectric material, may be conveniently referred to as a mid-K dielectric material, as defined above.

In one embodiment, the reaction product has a K which can be estimated by finding the weighted average of the K's of the high-K dielectric material and the standard-K dielectric material. For example, a reaction product having a K of about 17 would be obtained from an equal number of sub-layers of equal thickness of hafnium oxide, having a K of about 24, and aluminum oxide, having a K of about 10. In another example, a reaction product having a K of about 15 would be obtained from an equal number os sub-layers of equal thickness of hafnium oxide, having a K of about 24, and a mixed aluminum oxide/silicon oxide, having a K of about 6. Thus, by selection of the material composition, number and thickness of layers, of both the high-K dielectric material and the standard-K dielectric material, the K value of the reaction product and of the composite dielectric material is possible.

The composite dielectric layer, in one embodiment, is an amorphous material. In one embodiment, the composite dielectric layer of the present invention, when formed from hafnium oxide, a usually crystalline material, and aluminum oxide, also a usually crystalline material, has an amorphous structure. In an embodiment in which the high-K dielectric material is normally crystalline, and in which at least a partial sub-layer of the high-K dielectric material remains in the composite dielectric layer, the high-K dielectric material may be present in a crystalline form or may be rendered amorphous. The normally crystalline high-K material may be rendered amorphous or less crystalline by the proximity of the amorphous reaction product or as a result of the complex chemical structure of the reaction product, which may not lend itself to a crystalline structure. In an embodiment in which the standard-K dielectric material is a mixed aluminum oxide-silicon-containing material, the material would be expected to be amorphous.

The sub-layers may be applied in thicknesses and numbers appropriate to the desired final, total thickness of the composite dielectric layer. The thicknesses and numbers of the sub-layers may be selected to control the ratios of high-K derived metal to aluminum to oxygen in the composite dielectric layer. For example, if a total final thickness of 50 angstroms (Å) is desired, three sub-layers of about 17 Å each, four sub-layers of about 12.5 Å each, or five sub-layers of about 10 Å may be used. With respect to the ratio of high-K derived metal to aluminum in the composite dielectric layer, consider an example in which the ratio of high-K derived metal to aluminum is desired to be relatively high in a 50 Å thick composite dielectric layer. Five sub-layers of about 10 Å each may be used, in which the first and third and fifth sub-layers are the high-K derived metal, for example, hafnium oxide, and the second and fourth sub-layers are aluminum oxide. This arrangement will yield a dielectric layer relatively rich in hafnium, as compared to a composite using, for example, four sub-layers of about 12.5 Å, in which two of the sub-layers are hafnium oxide and two of the sub-layers are aluminum oxide. If a further increase in the K value, or in the ratio of high-K derived metal to aluminum in the composite dielectric layer is desired, the thicknesses of the sub-layers of high-K dielectric material may be increased with respect to the thicknesses of the standard-K dielectric material. Similarly, an increase in the relative thickness or number of sub-layers of standard-K dielectric material vis-a-vis the high-K dielectric material will reduce the K of the composite dielectric layer, as compared to a composite dielectric layer having relatively less thick or less numerous sub-layers vis-a-vis the high-K dielectric material.

The layered dielectric structure and the composite dielectric layer 110 illustrated in FIGS. 1–9 are depicted with discrete sub-layers. When the sub-layers, e.g., sub-layers 110$a$, 110$b$ and 110$c$, are deposited, the sub-layers may be discrete as shown in FIGS. 2–6, for example. Following the step of annealing described below, in which the respective first and second dielectric materials in the sub-layers combine or react with each other to form a reaction product which is a composite or hybrid material, to some degree each of the discrete sub-layers, including the sub-layers 110$rp$ of the reaction product, will be blended into the adjacent sub-layers, so that the boundary from one sub-layer to the next may be indeterminate. Thus, the various sub-layers shown in the drawings are depicted with discrete boundaries, but this may not be the case in actual practice.

Methods of Fabricating a Composite Dielectric Layer in a Semiconductor Device The present invention further relates to a method of fabricating the above-described semiconductor device. Thus, the present invention includes a method of fabricating a semiconductor device having a composite dielectric layer. The method includes the steps of providing a semiconductor substrate; depositing on the semiconductor substrate alternating sub-layers of a first dielectric material and a second dielectric material, which together form a layered dielectric structure. The layered dielectric structure has at least two sub-layers of at least one of the first dielectric material and the second dielectric material. One of the first dielectric material and the second dielectric material is a high-K dielectric material and the other of the first dielectric material and the second dielectric material is a standard-K dielectric material. In one embodiment, the standard-K dielectric material comprises aluminum oxide. When the alternating sub-layers have been formed into the layered dielectric structure, the structure is annealed at an elevated temperature. During the annealing, the materials of the first and second dielectric materials react together or combine to form a composite dielectric layer. In one embodiment, the composite dielectric layer includes a reaction product of the respective high-K dielectric material and standard-K dielectric material. The reaction product is formed at least at the interfaces of the respective alternating sub-layers of high-K dielectric material and standard-K dielectric material.

The method of fabricating a semiconductor device having a composite dielectric layer is described in the following disclosure with reference to FIGS. 1–10. FIG. 10 is a flow diagram schematically presenting the steps of fabricating the semiconductor device of the present invention.

Figure 2:
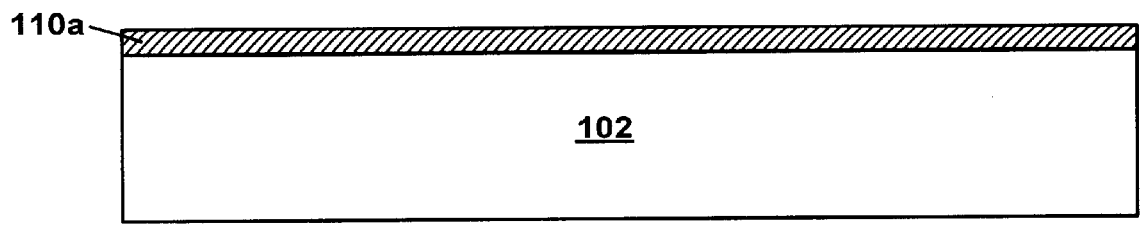
FIG. 2 is a schematic cross-sectional view of a semiconductor substrate with a first sub-layer applied thereto in accordance with the present invention.

In the first step of the method of the present invention, shown in FIG. 10 as Step S1001, a semiconductor substrate 102 is provided, as shown in, e.g., FIG. 2. The semiconductor substrate may be any appropriately selected semiconductor substrate known in the art, as described above.

In the second step of the method of the present invention, shown in FIG. 10 as Step S1002, a series of alternating sub-layers 110$a$, 110$b$, 110$c$, . . . 110$\omega$, of high-K and standard-K dielectric materials are formed on the semiconductor substrate 102 resulting in formation of the layered dielectric structure 110. As shown in FIG. 10, the second step, S1002, can be broken down into a series of sub-steps S1002-1 . . . S1002-$\omega$, in which the series of alternating sub-layers 110$a$ . . . 110$\omega$ are deposited.

In one embodiment, either or both of the standard-K dielectric material and the high-K dielectric material may be deposited by chemical vapor deposition (CVD). The CVD method may be any appropriate CVD method known in the art for deposition of aluminum oxide and, in appropriate embodiments, silicon dioxide, silicon oxynitride and silicon nitride. For example, the CVD method may be ALD (ALCVD), PECVD, RTCVD or MLD. In one embodiment, both the high-K dielectric material and the standard-K dielectric material are deposited in the same apparatus. In another embodiment, both the high-K dielectric material and the standard-K dielectric material are deposited in the same apparatus, and these materials are deposited sequentially by controlling the supply of precursor materials to the CVD apparatus.

Thus, for example, in an embodiment in which hafnium oxide and aluminum oxide are the first and second dielectric materials, the hafnium may be supplied in the form of a hafnium-containing vapor or gas such as hafnium tetra-t-butoxide, the aluminum may be supplied in the form of an aluminum-containing gas or vapor, such as aluminum tri-isopropoxide, and the oxygen is supplied in gaseous form as oxygen, $O_2$ or nitrous oxide, $N_2O$. In this embodiment, if the first sub-layer is to be hafnium oxide, the hafnium-containing gas and oxygen are first provided to the CVD apparatus. When a suitable thickness of hafnium oxide has been deposited, the flow of the hafnium-containing vapor or gas is stopped, and a flow of aluminum vapor is provided to the CVD apparatus together with the oxygen gas. When a suitable thickness of aluminum oxide has been deposited, the flow of the aluminum vapor is stopped, and the flow of hafnium-containing vapor or gas is started again, together with the oxygen gas, and continued until a suitable thickness of hafnium oxide is deposited. This process of alternating sub-layer deposition is continued until a suitable, selected number of sub-layers of desired thickness has been deposited. A silicon containing gas, such as $SiH_4$, may be provided together with or alternating with the aluminum vapor, during the step of forming the standard-K dielectric material sub-layers, in an embodiment in which a standard-K dielectric comprising both aluminum and silicon is to be produced.

In an alternative embodiment, the sub-layers may be deposited one at a time, each in a separate apparatus. This alternative embodiment allows for different deposition methods to be used for the respective sub-layers.

The sources of metals for CVD application of both the high-K and standard-K dielectric materials may be any appropriate source material known in the art.

FIG. 2 shows the semiconductor substrate 102 after application of a first sub-layer 110$b$ of a first dielectric material, i.e., at the completion of sub-step S1002-1.

Figure 3:
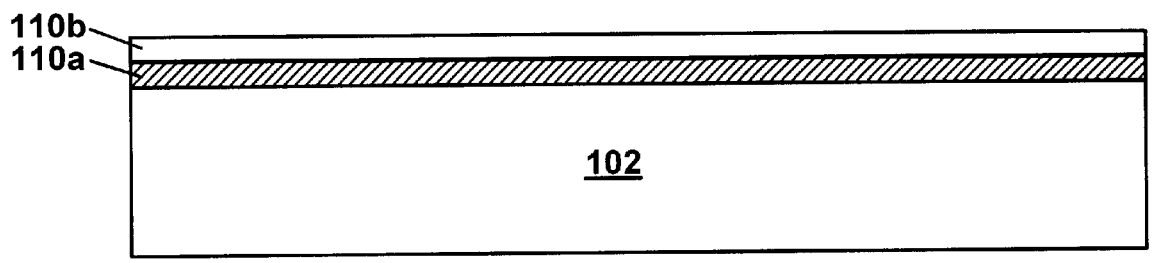
FIG. 3 is a schematic cross-sectional view of a semiconductor substrate with first and second sub-layers applied thereto in accordance with the present invention.

FIG. 3 shows the semiconductor substrate 102 after application of a second sub-layer 110c of a second dielectric material, i.e., at the completion of sub-step S1002-2.

FIG. 4 shows the semiconductor substrate 102 after application of a third sub-layer 110c of the first dielectric material, i.e., at the completion of sub-step S1002-3.

The sub-steps S1002-1 to S1002-ω of the Step S1002 are repeated and continued until a selected number ω of sub-layers 110ω has been deposited to form a layered dielectric structure 110. In the embodiment illustrated in FIG. 4, sub-steps S1002-1 through S1002-3 have been carried out, to deposit the layered dielectric structure 110 having a total of three sub-layers 110a–110c (ω=3).

In the embodiment illustrated in FIG. 5, sub-steps S1002-1 through S1002-5 have been carried out, to deposit the layered dielectric structure 110 having a total of five sub-layers 110a–110e (ω=5). In the embodiment illustrated in FIG. 6, sub-steps S1002-1 through S1002-4 have been carried out, to deposit the layered dielectric structure 110 having a total of four sub-layers 110a–110d (ω=4). Deposition of the sub-layers 110a–110ω forms a layered dielectric structure 110, as shown in FIGS. 4, 5 and 6.

When a suitable number of sub-layers has been deposited on the semiconductor substrate, the layered dielectric structure is annealed, as shown in Step S1003 in FIG. 10. As a result of the step of annealing, the sub-layers of the high-K dielectric material and the standard-K dielectric material in the layered dielectric structure 110 react or combine, at least at the interfaces between adjacent sub-layers, to form the composite dielectric layer 110. Several embodiments of the composite dielectric layer 110 are shown in FIGS. 1 and 7–9.

The annealing step is carried out at a temperature in the range from about 700° C. to about 1150° C. In one embodiment, the annealing temperature is in the range from about 950° C. to about 1100° C., and in another it is about 1000° C. to about 1050° C. In one embodiment, the annealing step is applied as an RTA technique, in which annealing is performed for a few seconds to a few minutes. The annealing time should be sufficient to form the composite dielectric layer, as described herein. In one embodiment, the annealing time is sufficient to form a reaction product which is a composite of the high-K dielectric material and the standard-k dielectric material.

In one embodiment, the annealing step is carried out in an atmosphere comprising $O_2$, NO, $N_2O$ or $N_2$ or mixtures thereof. In another embodiment, the annealing step is carried out in an atmosphere which includes oxygen, and in one embodiment, the atmosphere is air. In another embodiment, the atmosphere is an inert gas such as nitrogen or argon. In another embodiment, the annealing step is carried out in a reducing atmosphere, such as hydrogen, $H_2$, or ammonia, $NH_3$.

In one embodiment, the annealing step is carried out at a reduced pressure, in one embodiment under a vacuum in the range from approximately 0.01 Torr to about 1 Torr.

In general, the annealing step may be carried out by any method and under any conditions suitable for the materials, and which will result in the formation of the reaction product of which the composite dielectric layer is comprised, as will be understood by those skilled in the art.

As a result of the annealing step, a reaction or other combination occurs between the high-K dielectric material and the standard-K dielectric material, at least at the interfaces between adjacent sub-layers of the respective dielectric materials. This reaction or combination forms the reaction product.

As described above, the reaction product represents a composite of the high-K dielectric material and the standard-K dielectric material, and may occur (a) substantially only at the interfaces between the adjacent sub-layers, or (b) both at the interfaces and extending partially through the adjacent sub-layers, or (c) substantially throughout the entirety of the sub-layers. In either of (a) or (b), the composite dielectric layer which is formed comprises at least some portion of the sub-layers of the high-K dielectric material and the standard-K dielectric material together with at least some portion of a reaction product sub-layer. In (c), substantially the entirety of the composite dielectric layer is the reaction product.

Figure 7:
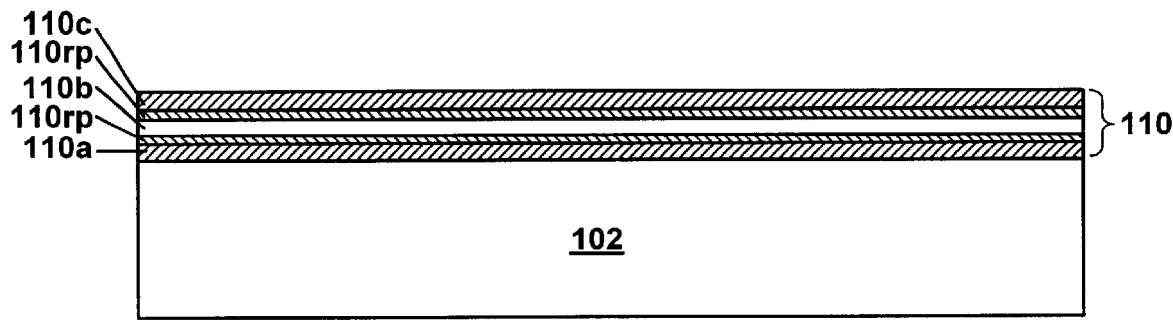
FIG. 7 is a schematic cross-sectional view of one embodiment of a semiconductor substrate following a step of annealing.
Figure 8:
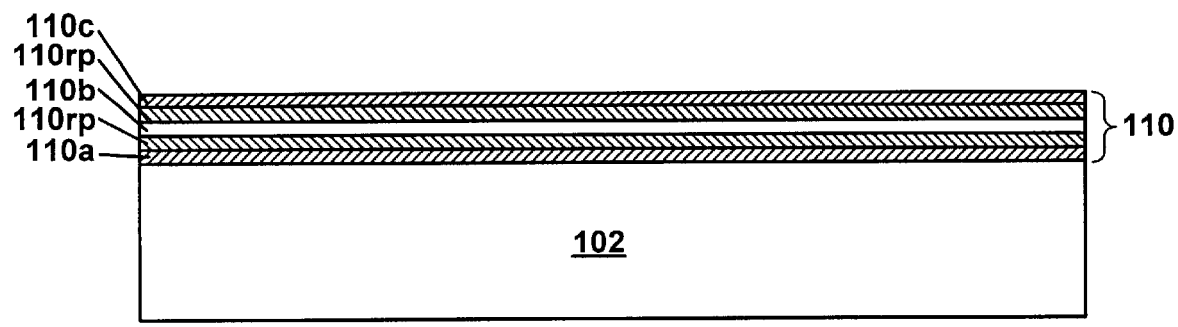
FIG. 8 is a schematic cross-sectional view of another embodiment of a semiconductor substrate following a step of annealing, similar to that shown in FIG. 7.
Figure 9:
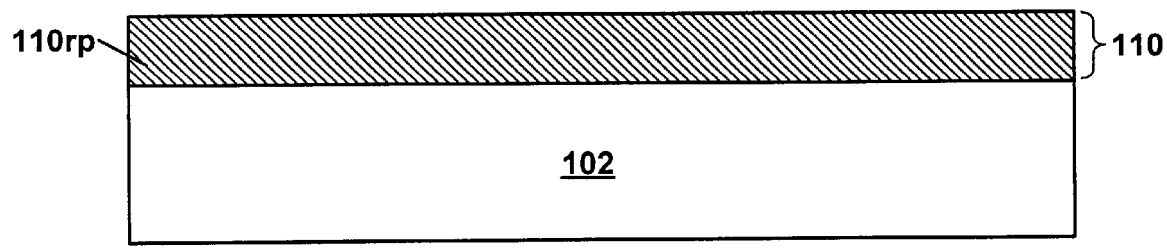
FIG. 9 is a schematic cross-sectional view of yet another embodiment of a semiconductor substrate following a step of annealing, similar to that shown in FIGS. 7 and 8.
Figure 10:
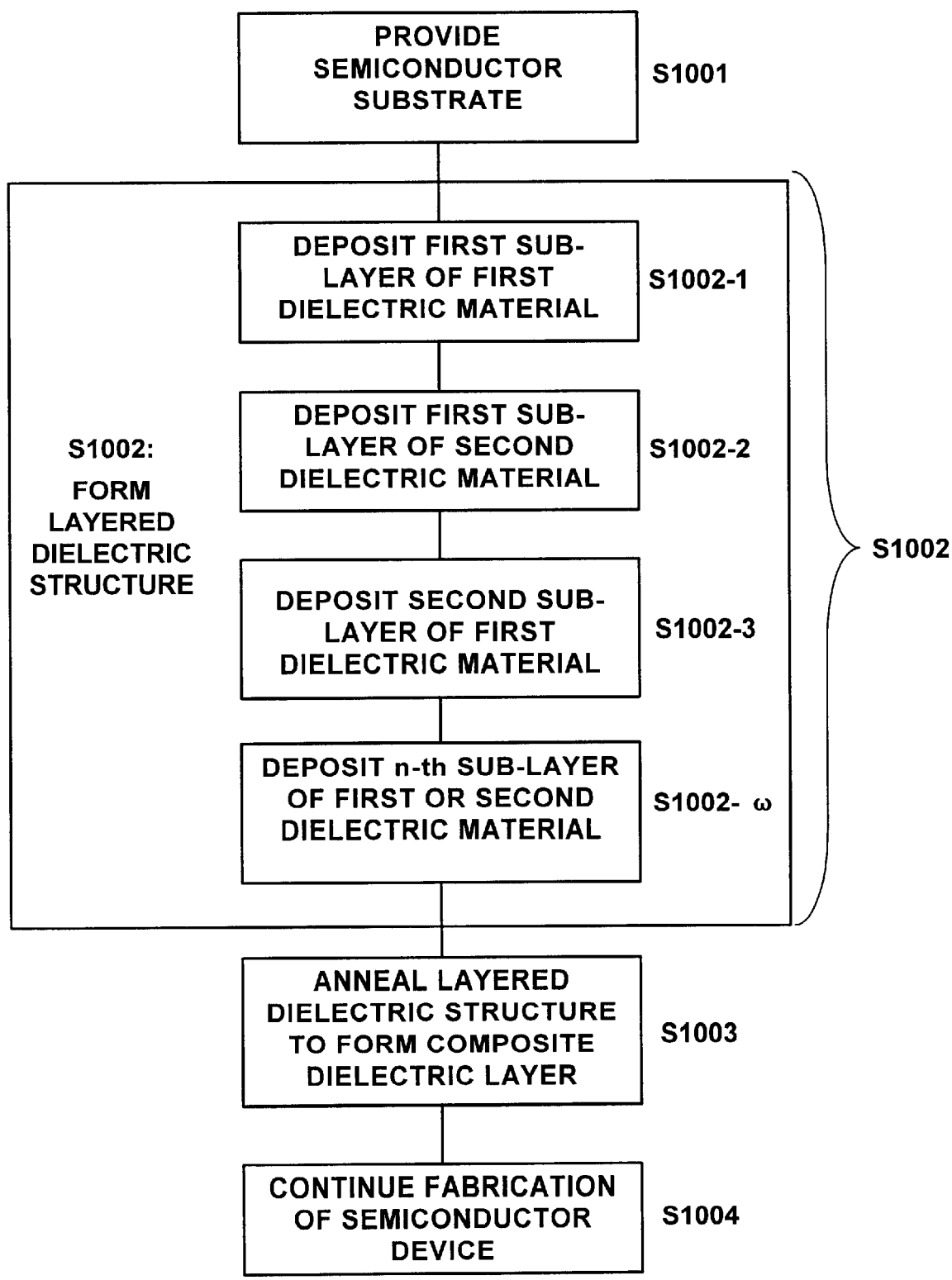
FIG. 10 is a schematic flow diagram showing the basic steps in a process of fabricating a semiconductor device in accordance with the present invention.

FIGS. 7–9 show schematically conditions (a), (b) and (c), respectively, each following a step of annealing. FIG. 7 shows schematically an embodiment which corresponds to condition (a), in which the reaction product has been formed substantially only at the interfaces between the first and second dielectric material sub-layers. As shown in FIG. 7, a substantial portion of each of the original first and second dielectric material sub-layers 110a–110c remain, but the sub-layers 110a–110c are now separated by two additional sub-layers 110rp of the reaction product. The embodiment shown in FIG. 1 is similar to that shown in FIG. 7, and also corresponds to condition (a).

FIG. 8 shows schematically an embodiment which corresponds to condition (b), in which the reaction product has been formed both at the interfaces and extending partially through the adjacent sub-layers. As shown in FIG. 8, a portion of each of the original first and second dielectric material sub-layers 110a–110c remain, and the remaining sub-layers 110a–110c are separated by two additional sub-layers 110rp of the reaction product, which are relatively thicker than the embodiment shown in FIG. 7.

FIG. 9 shows schematically an embodiment which corresponds to condition (c), in which the reaction product has been formed substantially through the entirety of the composite dielectric layer 110. As shown in FIG. 9, the reaction product sub-layer 110rp extends substantially through the entire thickness of the composite dielectric layer 110. In one embodiment, the composite dielectric layer includes or is a substantially uniform layer of the reaction product of the first dielectric material and the second dielectric material.

The extent of formation of the reaction product sub-layer 110rp, and thereby the content of the reaction product in the composite dielectric layer 110, can be selectively controlled by adjustment of the temperature and time of the annealing step S1003. A longer time and/or a higher temperature annealing step S1003 results in increased formation of the reaction product and a relative thickening of the reaction product sub-layer 110rp, as compared to a lower temperature or a shorter time annealing step S1003, given the same starting dielectric material layers.

As will be recognized by those of skill in the art, each sub-layer 110a–110ω is quite thin. In one embodiment, the thickness of each sub-layer is in the range from about 5 Å to about 50 Å. As a result, it may be difficult to discern whether a given composite dielectric layer 110 corresponds to condition (a), (b) or (c), as described above. The thicknesses of the sub-layers are so small that it may not be possible to determine with certainty whether or to what extent discreet sub-layers remain. Suitable analytical equipment may discern the identity of the dielectric material at various levels of the composite dielectric layer 110.

While the invention has been described in conjunction with specific embodiments herein, it is evident that many alternatives, modifications and variations will be apparent to those skilled in the art in light of the foregoing description. Accordingly it is intended to embrace all such alternatives and modifications in variations as for within the spirit and broad scope of the appended claims.

What is claimed is:

1. A method of fabricating a semiconductor device having a composite dielectric layer, comprising:

providing a semiconductor substrate;

depositing on the semiconductor substrate alternating sub-layers comprising a first dielectric material and a second dielectric material to form a layered dielectric structure having at least two sub-layers of at least one of the first dielectric material and the second dielectric material, wherein one of the first dielectric material and the second dielectric material is a high-K dielectric material and an other of the first dielectric material and the second dielectric material is a standard-K dielectric material comprising aluminum oxide; and annealing the layered dielectric structure at an elevated temperature to form a composite dielectric layer.

2. The method of claim 1, wherein the standard-K dielectric material further comprises at least one of silicon dioxide, silicon oxynitride, silicon nitride, and silicon-rich silicon nitride.

3. The method of claim 2, wherein during the step of annealing, the first dielectric material and the second dielectric material form an aluminum-containing reaction product in the composite dielectric layer.

4. The method of claim 2, wherein the composite dielectric layer further comprises a mixed aluminate/silicate.

5. The method of claim 3, wherein the reaction product comprises a high-K derived metal atom, an aluminum atom and an oxygen atom.

6. The method of claim 1, wherein the high-K dielectric material comprises at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAl_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$).

7. The method of claim 1, wherein the first dielectric material is the high-K dielectric material.

8. The method of claim 1, wherein the second dielectric material is the high-K dielectric material.

9. The method of claim 1, wherein the composite dielectric layer comprises at least a portion of the sub-layers of the first dielectric material and the second dielectric material, separated by a sub-layer of a reaction product of the first dielectric material and the second dielectric material.

10. The method of claim 1, wherein the composite dielectric layer comprises a substantially uniform layer of a reaction product of the first dielectric material and the second dielectric material.

11. The method of claim 1, wherein thicknesses of the sub-layers is selected to provide a selected ratio of high-K derived metal to aluminum to oxygen in the composite dielectric layer.

12. A method of fabricating a semiconductor device having a composite dielectric layer, comprising:

providing a semiconductor substrate;

depositing on the semiconductor substrate alternating sub-layers comprising a first dielectric material and a second dielectric material to form a layered dielectric structure having at least two sub-layers of at least one of the first dielectric material and the second dielectric material, wherein one of the first dielectric material and the second dielectric material is a high-K dielectric material and an other of the first dielectric material and the second dielectric material is a standard-K dielectric material comprising aluminum oxide and at least one of silicon dioxide, silicon oxynitride, silicon nitride, and silicon-rich silicon nitride; and annealing the layered dielectric structure at an elevated temperature to form a composite dielectric layer comprising a reaction product of the first dielectric material and the second dielectric material.

13. The method of claim 12, wherein the reaction product comprise a high-K derived metal atom, a silicon atom, an aluminum atom and an oxygen atom.

14. The method of claim 12, wherein the high-K dielectric material comprises at least one of hafnium oxide $HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$).

15. The method of claim 12, wherein the first dielectric material is the high-K dielectric material.

16. The method of claim 12, wherein the second dielectric material is the high-K dielectric material.

17. The method of claim 12, wherein the composite dielectric layer comprises at least a portion of the sub-layers of the first dielectric material and the second dielectric material, separated by a sub-layer of a reaction product of the first dielectric material and the second dielectric material.

18. The method of claim 12, wherein the composite dielectric layer comprises a substantially uniform layer of a reaction product of the first dielectric material and the second dielectric material.

19. A method of fabricating a semiconductor device having a composite dielectric layer, comprising:

providing a semiconductor substrate;

depositing on the semiconductor substrate alternating sub-layers comprising a first dielectric material and a second dielectric material to form a layered dielectric structure having at least two sub-layers of at least one of the first dielectric material and the second dielectric material, wherein one of the first dielectric material and the second dielectric material is a high-K dielectric material and an other of the first dielectric material and the second dielectric material is a standard-K dielectric material comprising aluminum oxide; and annealing the layered dielectric structure at an elevated temperature to form a composite dielectric layer comprising a reaction product of the first dielectric material and the second dielectric material, wherein the reaction product comprises a high-K derived metal atom, an aluminum atom and an oxygen atom.

20. The method of claim 19, wherein the standard-K dielectric material further comprises at least one of silicon dioxide, silicon oxynitride, silicon nitride, and silicon-rich silicon nitride, and the reaction product further comprises a silicon atom.

* * * * *